United States Patent
Boyd et al.

(10) Patent No.: US 6,305,565 B1
(45) Date of Patent: Oct. 23, 2001

(54) TRANSPORT CHAMBER AND METHOD FOR MAKING SAME

(75) Inventors: Trace L. Boyd, San Jose; Eric A. Terbeek, Fremont, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/256,704

(22) Filed: Feb. 24, 1999

Related U.S. Application Data

(62) Division of application No. 08/677,401, filed on Jul. 9, 1996, now Pat. No. 6,216,328.

(51) Int. Cl.[7] .................................................. B65D 8/02
(52) U.S. Cl. .......................................... 220/4.26; 220/676
(58) Field of Search ........................... 206/501; 220/4.26, 220/378, 676

(56) References Cited

U.S. PATENT DOCUMENTS

| | | | |
|---|---|---|---|
| 2,472,620 | * 6/1949 | Rhodes et al. | |
| 3,990,035 | * 11/1976 | Byers | 367/141 |
| 4,203,525 | * 5/1980 | Okubo | 220/4.26 |
| 4,978,023 | * 12/1990 | Behlmann et al. | 220/23.6 |
| 5,277,328 | * 1/1994 | Tocco | |

* cited by examiner

*Primary Examiner*—Stephen Castellano
(74) *Attorney, Agent, or Firm*—Martine & Penilla, LLP

(57) ABSTRACT

A transport chamber implemented to retrieve a substrate from at least one storage facility that is external to the transport chamber and transition the substrate into at least one processing chamber that is external to the transport chamber is provided. The transport chamber includes a bottom plate having an inner surface that is configured to accept a first O-ring. Further provided is a chamber housing that is defined from a rolled forging. The chamber housing has a top surface, and a bottom surface that is designed to join with the inner surface of the bottom plate such that the first O-ring seal forms a seal. The top surface of the chamber housing is suited to accept a second O-ring seal fastened to the perimeter of the top surface of the chamber housing. The transport chamber further includes a top plate that is configured to sit over the second O-ring seal and thereby form a seal over the top surface of the chamber housing.

7 Claims, 8 Drawing Sheets

TRANSPORT CHAMBER AND METHOD FOR MAKING SAME

This is a Divisional application of prior Application Ser. No. 08/677,401 filed on Jul. 9, 1996, now U.S. Pat. No. 6,216,328.

BACKGROUND OF THE INVENTION

The present invention relates generally to chambers, and more particularly, to substrate transport chambers and methods of efficiently manufacturing the same.

Transport modules are generally used in conjunction with a variety of substrate processing modules, which may include semiconductor processing systems, material deposition systems, and flat panel display processing systems. Due to the growing demands for cleanliness and high processing precision, there has been a growing need to reduce the amount of human interaction between processing steps. This need has been partially met with the implementation of transport modules which operate as an intermediate handling apparatus (typically maintained at a reduced pressure, e.g., vacuum conditions). By way of example, a transport module may be physically located between one or more clean room storage facilities where substrates are stored, and multiple substrate processing modules where the substrates are actually processed, e.g., etched or have deposition performed thereon.

In this manner, when a substrate is required for processing, a robot arm located within the transport module may be employed to retrieve a selected substrate from storage and place it into one of the multiple processing modules. As is well known to those skilled in the art, the use of a transport module to "transport" substrates among multiple storage facilities and processing modules is typically referred to as a "cluster tool architecture".

FIG. 1 depicts a typical cluster tool architecture 100 illustrating the various chambers that interface with a transport module 106. Transport module 106 is shown coupled to three processing modules 108a–108c which may be individually optimized to perform various fabrication processes. By way of example, processing modules 108a–108c may be implemented to perform transformer coupled plasma (TCP) substrate etching, layer depositions, and sputtering. There may be connected to transport module 106 a load lock 104, through which substrates may be provided to transport module 106.

As illustrated, load lock 104 is coupled to a clean room 102 where substrates may be stored. In addition to being a retrieving and serving mechanism, load lock 104 also serves as a pressure varying interface between transport module 106 and clean room 102. Therefore, transport module 106 may be kept at a constant pressure (e.g., vacuum), while clean room 102 is kept at atmospheric pressure.

As the demand for larger substrates increases, the need for transport modules capable of transporting these larger substrates also increases. Consequently, as the need for physically larger transport modules increases, existing manufactures of off-the-shelf transport modules have been struggling to develop larger transport modules in a cost effective manner. Unfortunately, existing methods of making these larger transport modules have proved to be extremely inefficient and prohibitively expensive to manufacture. For illustration purposes, the following will illustrate two common methods of manufacturing a transport chamber, which may represent, in one case, the transport module without the electronics.

FIG. 2A is a simplified transport chamber 200 assembled using conventional weldment technology. By way of example, transport chambers made by weldment technology generally require machined flat metal plates which are welded together to form boxed enclosures. As illustrated, transport chamber 200 is assembled into a box configuration 202 having four metal plate sides 204, and a bottom plate 206 welded together at linear intersections 208. Interface ports 210 will generally be required to form a path for the substrates to be transported into and out of transport chamber 200, and may be machined out before or after box 202 has been welded together. A top plate (not shown) may then be designed to fit over the top perimeter of side plates 204. In this manner, a seal may be formed when the top plate is welded or bolted down to box 202. If the top plate is bolted down, an O-ring seal is typically placed between the top plate and the top surface regions of side plates 204 before being bolted down to box 202.

As can be appreciated, the welding process may be very labor intensive in that the weld must be uniform and provide a vacuum-tight seal where the various plates meet. In addition, large amounts of machining time may be spent in preparing the various plates in order to generate smooth meeting surfaces for subsequent welding steps. By way of example, plates 204 must be precisely machined to smoothly match bottom plate 206. In this manner, less time is consumed adjusting plates that fail to meet up with each other. Finally, once box 202 has been welded together, additional time must be spent performing post-weldment machining to cure any heat generated warping that may have been introduced during the welding process. As is well known in the art, the intensity of the thermal heat introduced during a welding process may tend to cause extensive distortions that further increase the time and expenses associated with post-weldment machining processes used to face-off warped regions.

One disadvantage associated with a weldment-type transport chamber 200 is that it may have structural deficiencies due to the vast amount of linear inches requiring welding. For illustration purposes, relatively long regions of welding are required for large transport chambers having dimensions between 60 and 100 inches. The structural weakness introduced at welding interfaces therefore produces well known step-down regions. By way of example, if a welding interface were magnified and examined closely, a thinner plate dimension would result at weld interfaces. Therefore, in order to prevent the introduction of structural weaknesses, more time and expense must be invested to assure that typical loads up to about 75,000 pounds are withstood. Further, welded structures may cause failures associated with long term fatigue.

In addition, once all post weldment machining is complete, additional cleaning steps must be performed to remove any surface metal contamination introduced during welding. Consequently, further time, effort and expense must be invested in cleaning the finished transport chamber before being spun into operation.

FIG. 2B illustrates another conventional manufacturing process used to make transport chamber 250. The manufacturing process is sometimes referred to as a "hogout" process since transport chamber 250 is formed from an initial solid billet 254 of aluminum. Solid billet 254 is typically machined-out from one side in order to generate a hollow region in the center (e.g., thereby forming a box similar to that of FIG. 2A). A hogout transport chamber does provide certain advantages over weldment-type transport chambers, but other disadvantages are introduced. By way of example, the machining required to define a hollow region 256 in a large billet of aluminum tends to be very labor-intensive, and the machining process also tends to generate large quantities of unusable aluminum scraps.

Once the machining process is complete, hollow region 256 must be polished down to produce smooth sides and eliminate any contaminating materials or scrap. A top plate may then be designed to fit over the box structure generated from the machining process. Next, interface ports 258 are defined to provide the passageways for substrates to be introduced into and out of transport chamber 250.

In addition to being a very labor intensive process, generating transport chamber 250 from solid billet 254 is very expensive. As can be appreciated, solid billet 254 is remarkably heavy and must be paid for by the pound. Therefore, once the scrap is machined out, about 80 percent of the aluminum is wasted since industry does not pay well for recycled scraps.

There are entities that provide ready-made transport chambers of the weldment type and hogout type. By way of example, Brooks Automation of Lowell, Mass. is a supplier of ready-made chambers. Although there are companies that make custom transport chambers, the traditional method used to build weldment type or hogout type chambers is typically very expensive.

In view of the forgoing, what is needed is a transport chamber that employs a cost efficient manufacturing method for generating large transport chambers, without producing warping and structural deficiencies of a weldment, and without expending large amounts of time machining hollow regions in large solid billets which produce useless waste.

SUMMARY OF THE INVENTION

The present invention fills this need by disclosing a method of making a transport chamber having a robot arm installed within the transport chamber. In this embodiment, the robot arm may be implemented to retrieve a substrate from at least one storage facility that is external to the transport chamber, and insert the substrate into at least one processing chamber that is external to the transport chamber.

Preferably, the method of making the transport chamber includes: (a) providing a bottom plate having an inner surface; (b) defining a robot drive mounting port at about the center of the bottom plate, applying a first o-ring seal around the perimeter of the inner surface of the bottom plate; (c) generating a chamber housing from a rolled forging, the chamber housing having a top surface, and a bottom surface designed to meet the inner surface of the bottom plate such that the first o-ring seal forms a substantially vacuum-tight seal, and the top surface of the chamber housing having a second o-ring seal around the perimeter; and (d) providing a top plate having an underlip portion around the perimeter designed to sit over the second o-ring seal in order to form a substantially vacuum-tight seal against the top surface of the chamber housing.

Advantageously, one embodiment provides a fast and efficient method for installing and removing the transport chamber robot arm from at least one access window defined in the top plate. In addition, the interior portions of the transport chamber may be efficiently accessed through at least one viewport window in order to perform periodic maintenance.

In another embodiment, a transport chamber implemented to retrieve a substrate from at least one storage facility that is external to the transport chamber, and insert the substrate into at least one processing chamber that is external to the transport chamber is disclosed. The transport chamber includes: (a) a bottom plate having an inner surface; (b) a first O-ring seal fastened to the perimeter of the inner surface of the bottom plate; (c) a chamber housing machined from a rolled forging, the chamber housing having a top surface, and a bottom surface designed to join with the inner surface of the bottom plate such that the first o-ring seal forms a seal, and the top surface of the chamber housing having a second o-ring seal fastened to the perimeter of the top surface of the chamber housing; and (d) a top plate configured to sit over the second o-ring seal thereby forming a seal over the top surface of the chamber housing.

These and other advantages of the present invention will become apparent upon reading the following detailed descriptions and studying the various figures of the drawings.

DETAILED DESCRIPTION OF THE PREFERRED EMBODIMENTS

Figure 1:
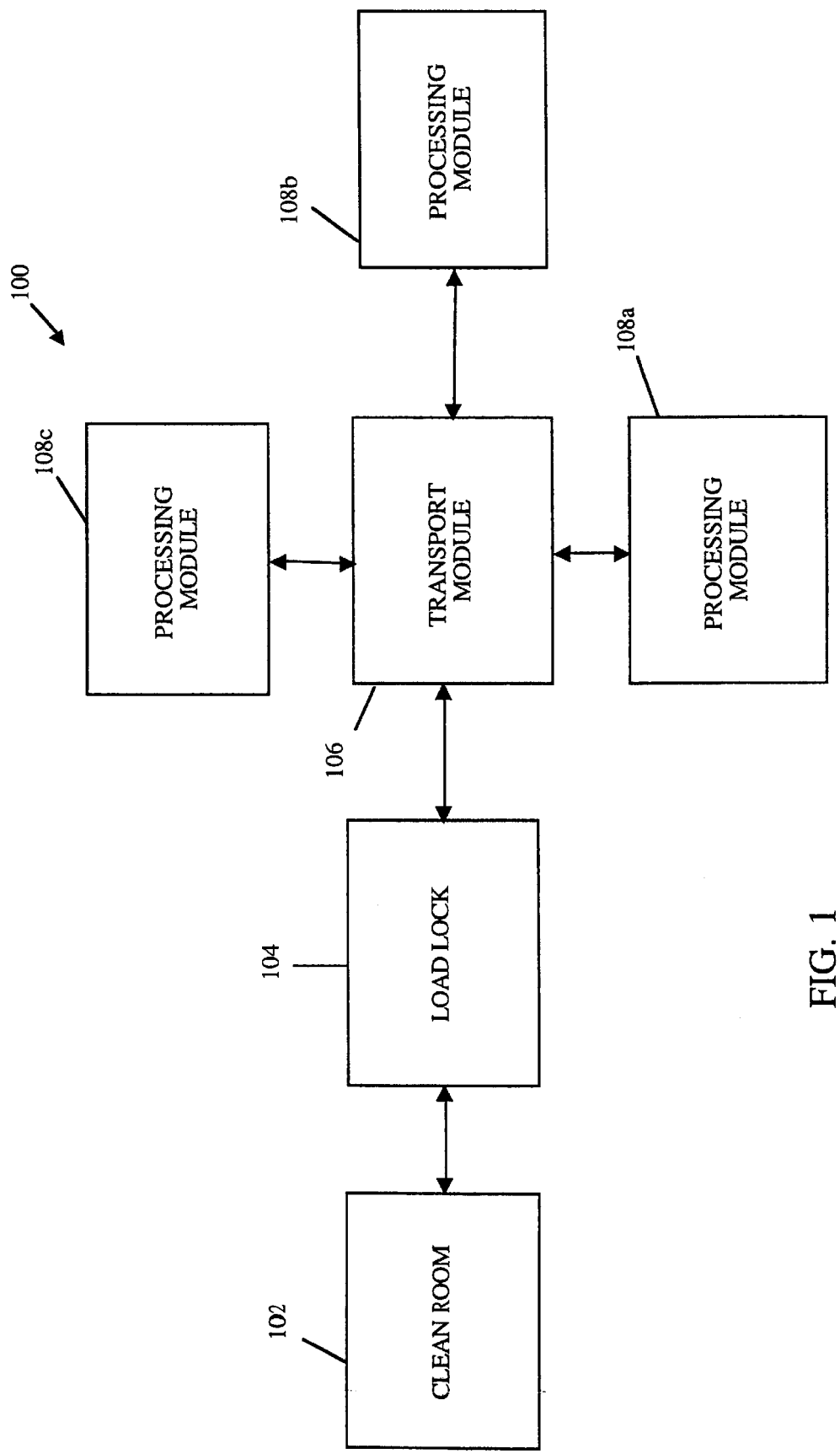
FIG. 1 is diagrammatic illustration of a typical cluster tool architecture which illustrates how various processing modules may be coupled to a transport module.
Figure 2A:
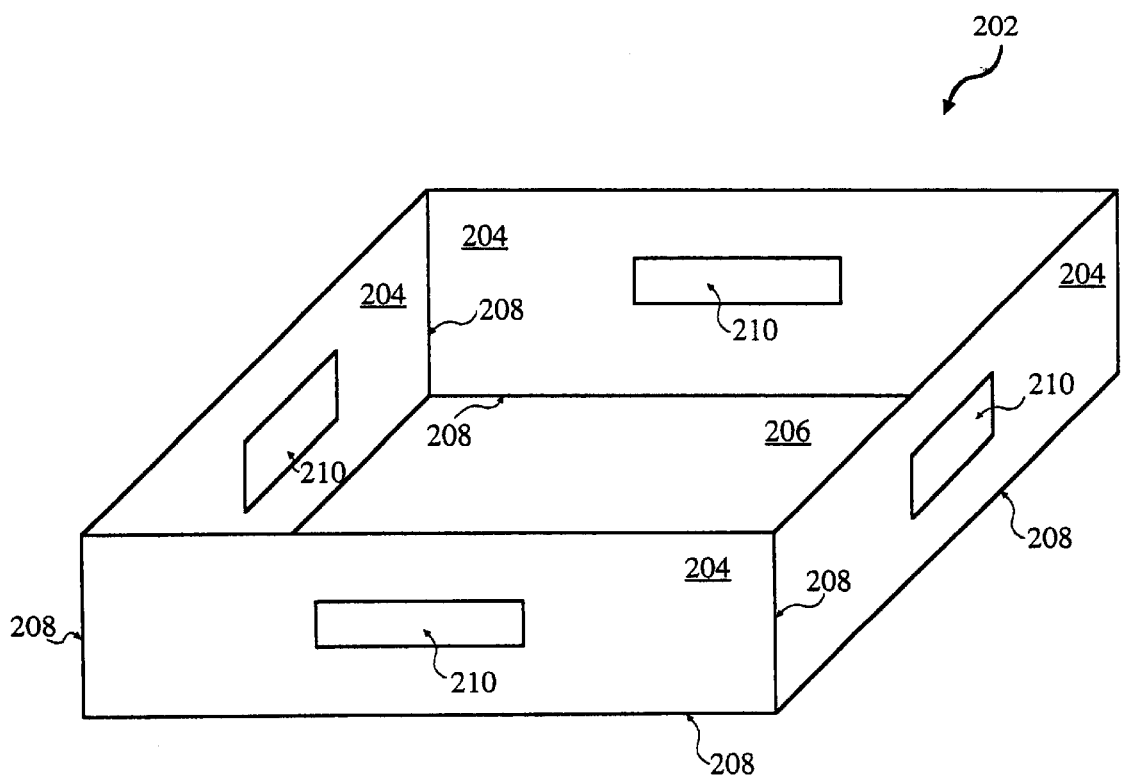
FIG. 2A is a simplified transport chamber assembled using conventional weldment technology.
Figure 2B:
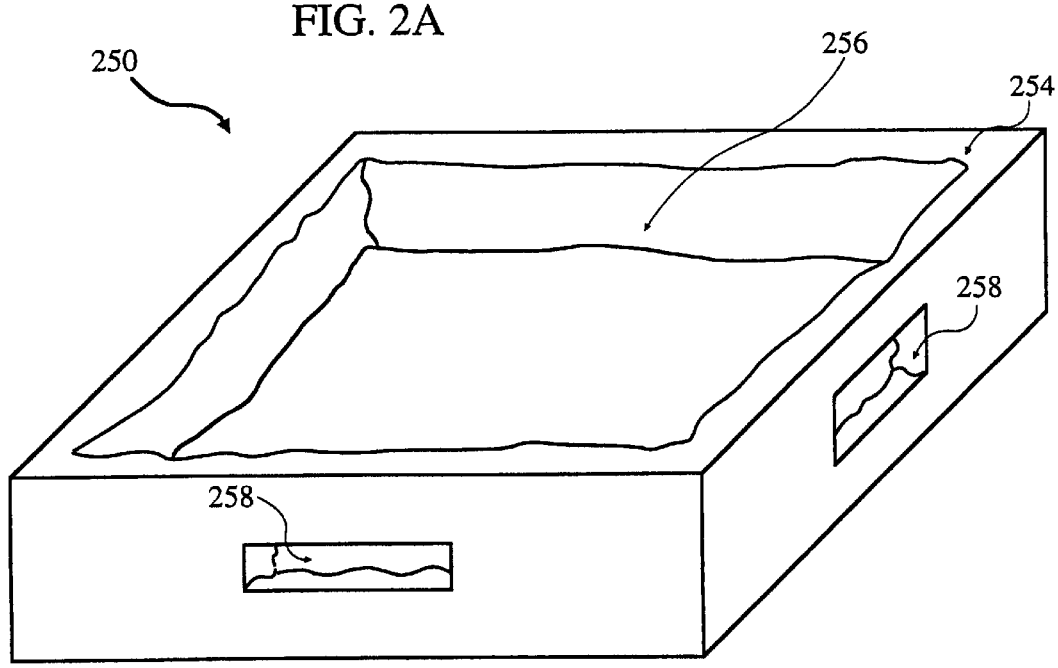
FIG. 2B is another conventional transport chamber defined from a solid billet of aluminum.

As described above, FIG. 1 schematically illustrates a typical cluster tool architecture and the relative positioning of transport module 106. FIGS. 2A and 2B illustrate a weldment-type and a hogout-type transport chamber respectively, and their associated manufacturing inefficiencies.

An invention is described for improving the efficiency of manufacturing large transport chambers through the implementation of a rolled forging. In the following description, numerous specific details are set forth in order to provide a thorough understanding of the present invention. It will be obvious, however, to one skilled in the art, that the present invention may be practiced without some or all of these specific details. In other instances, well known manufacturing steps have not been described in detail in order not to unnecessarily obscure the present invention.

Figure 3:
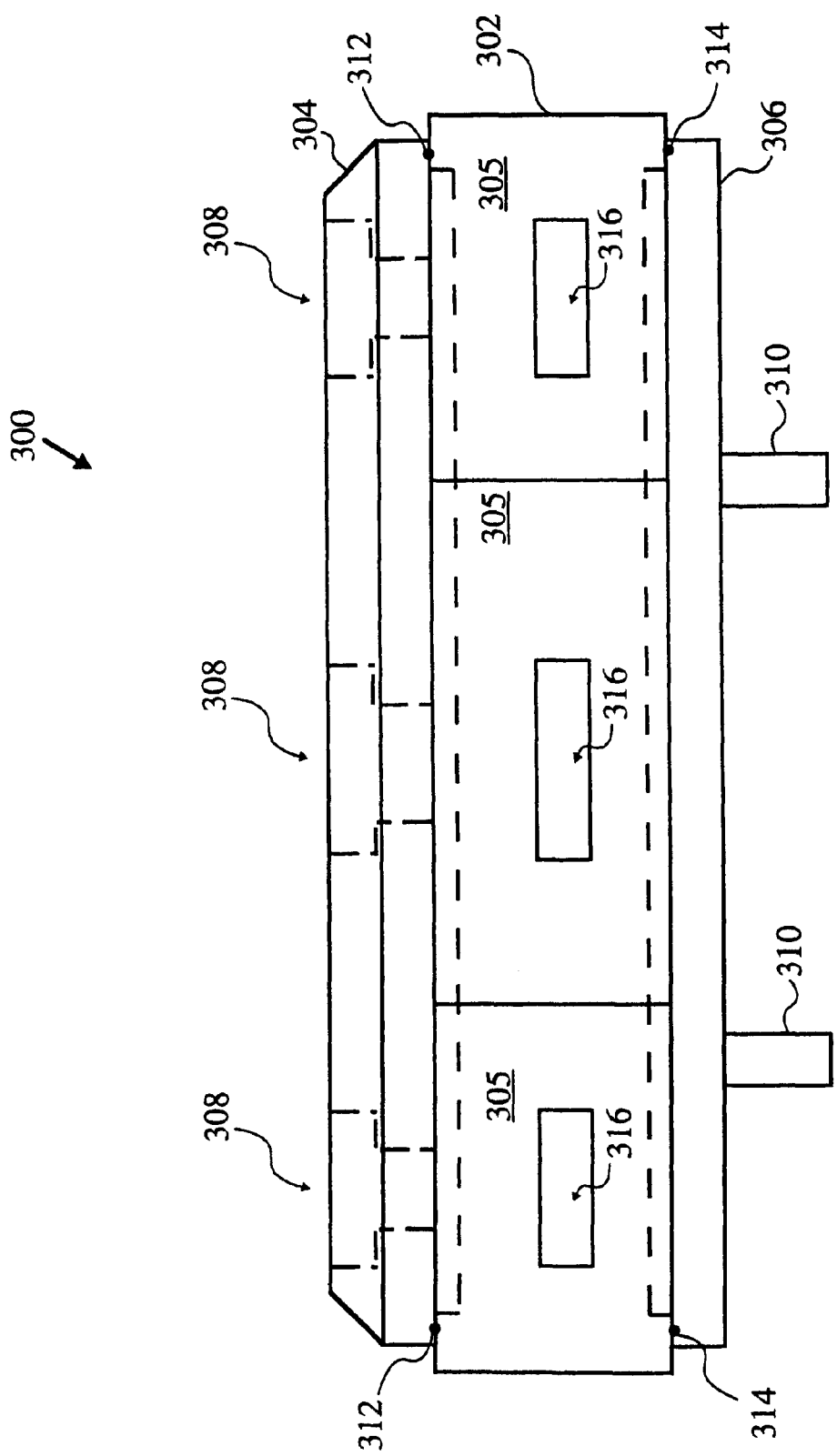
FIG. 3 is a side-view of a transport chamber manufactured in accordance with one embodiment of the present invention.

FIG. 3 is a side-view of a transport chamber 300 manufactured in accordance with one embodiment of the present invention. Transport chamber 300 generally includes a chamber housing 302, a bottom plate 306, and a top plate 304 all assembled to form a vacuum-tight chamber. In one embodiment, chamber housing 302 may have any number of facets 305 and interface ports 316. By way of example, there are seven facets 305 and seven interface ports 316 in this embodiment. As is well known in the art, facets 305 provide a surface area for other chambers to meet up against chamber housing 302. In this manner, a vacuum-tight seal may be formed between the various processing chambers and load lock chambers interconnected to transport chamber 300 as described in FIG. 1.

In this embodiment, at least one facet surface area 305 may be joined up against a load lock unit (e.g., load lock 104 of FIG. 1) to provide a pressure interface between a clean room storage facility and chamber housing 302. In this manner, transport chamber 300 may be maintained at a constant vacuum pressure which eliminates the need to pump down transport chamber 300 each time a new substrate is placed into or out of the chamber. By way of example, the pressure inside transport chamber 300 is preferably maintained at a pressure of between about 1 mTorr and about 150 mTorr, and more preferably between about 5 mTorr and about 100 mTorr, and preferably, at about 10 mTorr.

As shown, top plate 304 sits over a top surface of chamber housing 302, and an O-ring seal 312 is positioned such that a vacuum-tight seal is made when top plate 304 is bolted down to chamber housing 302. Similarly, bottom plate 306 may be bolted up against chamber housing 302 such that a vacuum-tight seal is made when O-ring seal 314 is positioned between chamber housing 302 and bottom plate 306. It should be appreciated that although top plate 304 and bottom plate 306 have been described as being bolted to chamber housing 302, any other suitable method of joining the respective plates may be substituted therefor. By way of example, suitable securing methods may include implementing clamps, straps, atmospheric force alone, threaded male and female connections, etc.

As illustrated, bottom plate 306 has two support beams 310 positioned below bottom plate 306 which provide additional structural support to transport chamber 300. Although support beams 310 may be constructed of any type of rigid material, preferably a mild steel which is readily available and may be used to provide a rigid structural base. However, it should be understood that the support beams 310 may be eliminated if bottom plate 306 is made sufficiently thick to withstand any operational pressures and structural requirements.

Preferably, chamber housing 302 may have an outer diameter of between about 12 inches and 400 inches, and more preferably, a outer diameter of between about 30 inches and 200 inches, and preferably about 90 inches from one corner of one facet to a diagonal corner of another facet. Further, the vertical height of transport chamber 302 may preferably be between about 3 inches and about 50 inches, and more preferably, between about 5 and about 25 inches, and preferably about 10 inches.

Further, interface ports 316 may have a horizontal width opening of between about 400 millimeters and 1,050 millimeters, and more preferably, between about 500 millimeters and 800 millimeters, and preferably about 650 millimeters. The opening height of each interface port 316 may preferably be between about 1,200 millimeters and 50 millimeters, and more preferably between about 500 millimeters and 65 millimeters, and preferably about 75 millimeters. When interface ports 316 are selected within these ranges, larger substrates having dimensions of about 1,000 millimeters by 1,000 millimeters may be transported in and out of transport chamber 300 when chamber housing 302 is designed large enough to accommodate the motion path of the largest substrate being transported.

Still referring to FIG. 3, top plate 304 is also shown having view ports 308 designed to provide viewing and access capabilities into transport chamber 300. By way of example, view ports 308 may provide an efficient passage for maintaining mechanical components (e.g., a gate drive valve) and cleaning particles. As is well known in the art, small atmospheric particles resulting from general use, small substrate particles and/or large substrate fragments may occasionally end up inside transport chamber 300. In such cases, it is typically desired that those particles be removed in order to prevent product defects or an obstruction for a robot arm (not shown for ease of illustration) that is responsible for transporting substrates. Further, view ports 308 may also provide time saving maintenance access for replacing various consumable O-ring seals that surround insert plates (not shown) that fit into interface ports 316.

Figure 4:
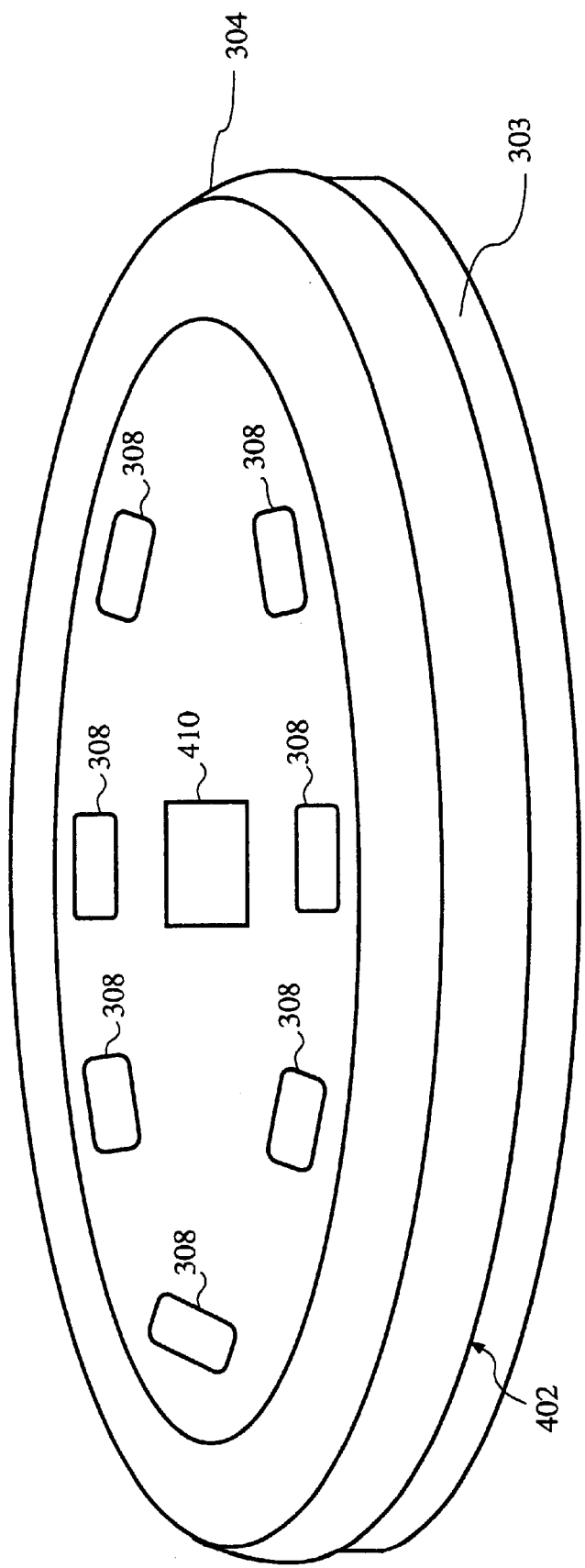
FIG. 4 is a magnified top-view of the top plate of the transport chamber of FIG. 3 in accordance with one embodiment of the present invention.

FIG. 4 is a magnified top-view of top plate 304 which illustrates some of the advantageous features associated with one embodiment of the present invention. By way of example, top plate 304 may include an access window 410 for installing and removing the aforementioned robot arm into transport chamber 300. Access window 410 may be of any suitable dimensional such that a robot arm may easily fit into transport chamber 300. As will be described in greater detail with reference to FIG. 6 below, once the robot arm is brought into transport chamber 300 through access window 410, the robot arm is attached to a robot arm drive which comes up through bottom plate 306.

Once the robot arm has been installed, access window may be closed. It should be appreciated that since access window may be a solid aluminum plate sealed down by O-rings, opening and closing may be difficult without a hinge (not shown for ease of illustration) designed to mechanically reduce the weight of access window 410. Although any type of lifting mechanism may be employed (or none at all), one type of hinge may be a Counterbalance™ which may be obtained from Counterbalance Corporation of Warminster, Pa.

Although viewport windows 308 are shown positioned over each interface port 316 as described with reference to FIG. 3, it should be understood that viewport windows 308 may be optional. Further, the positioning and shape of viewport windows 308 may be modified without departing from the spirit and scope of this embodiment. By way of example, viewport windows 308 may be circular, hexagonal, rectangular, etc., and there may be a greater or fewer number of viewport windows 308 than interface ports 316. In one embodiment, viewport windows 308 may be a clear two inch thick polycarbonate plastic which may be sealed down to top plate 304 by an O-ring. In this manner, a vacuum-tight seal may be maintained when transport chamber 300 is brought down to vacuum conditions. In this embodiment, Lexan® plastic which is available from General Electric Plastics of Pittsfield, Mass., may be used to make viewport windows 308.

Further, top plate 304 is shown having an underlip 402 which is designed to sealably sit over O-ring seal 312 which lies around the top surface of chamber housing 302 as illustrated in FIG. 3. In this manner, underlip 402 will fit over O-ring seal 312 as illustrated in FIG. 3. Top plate 304 may also have a reduced diameter protrusion 303 which is designed to fit into chamber housing 302, and further assures a more accurate positioning of top plate 304 into chamber housing 302 on axis.

In one embodiment, the thickness of top plate 304 may be between about 2 inches and 6 inches, and more preferably, between about 3 and 5 inches, and preferably about 4 inches. This thickness is preferably selected to withstand anticipated pressures of about 15 pounds per square inch. In this embodiment, anticipated deflections are typically not more than between about 1 inch and 0 inches, and more preferably, between about 0.5 inches and 0.1 inches, and preferably not more than about 0.2 inches. By way of example, the described deflections define the approximate degree by which the center region of top plate 304 may drop. That is, if the center region of top plate 304 does drop, a dish-like shape may be formed.

However, it should be appreciated that the above described deflections may vary depending upon the selected thickness, material and diameter of top plate 304. In this embodiment, top plate 304 may have a diameter of between about 12 inches and 400 inches, and more preferably, between about 30 inches and 200 inches, and preferably about 80 inches. Therefore, it should be appreciated that top plate 304 may be quite heavy when formed to, e.g., a thickness of about 4 inches. The weight further assures that underlip 402 seals tightly up against O-ring 312.

Figure 5A:
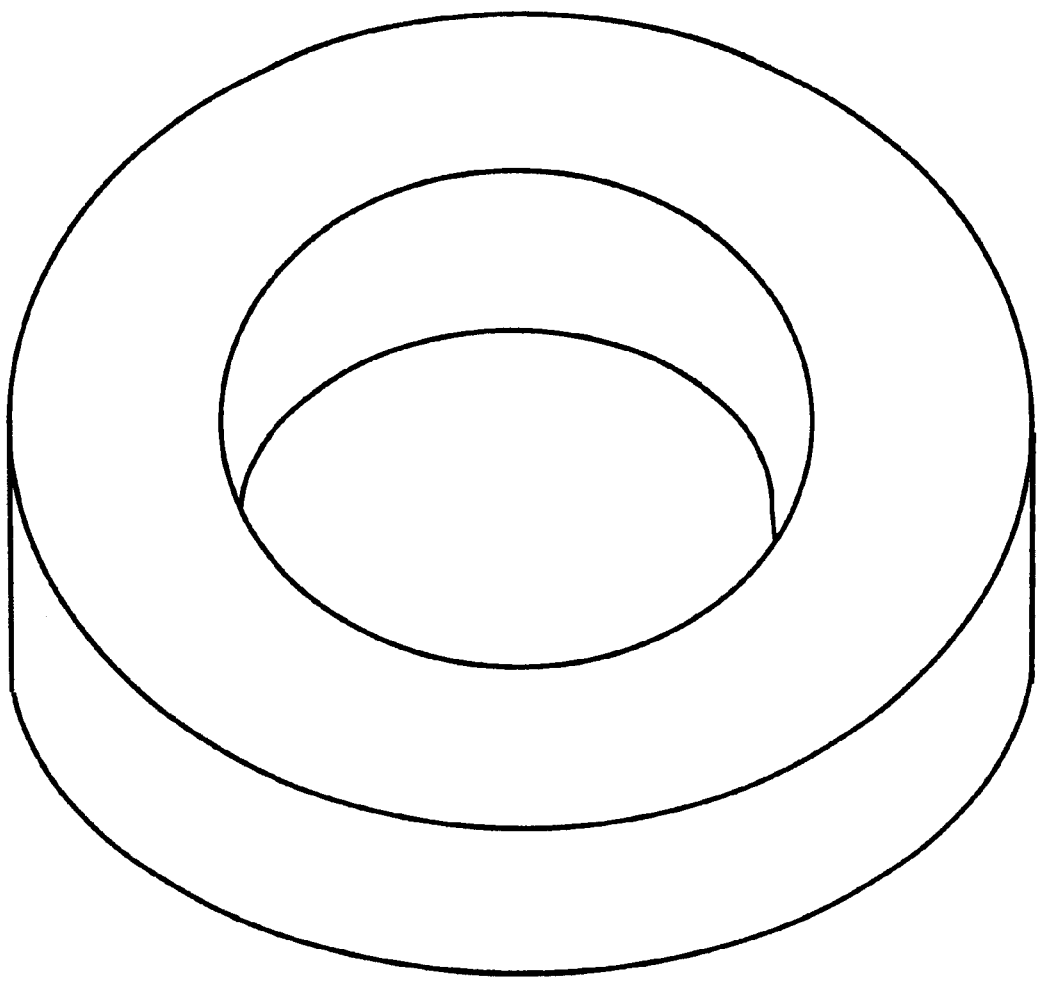
FIG. 5A is a representative rolled forging which is used to make the chamber housing of the transport chamber of FIG. 3 in accordance with a preferred embodiment of the present invention.

FIG. 5A is a representative rolled forging 500 which depicts a ring having an outer diameter, an inner diameter and a vertical height. In this embodiment, rolled forging 500 may be a solid aluminum ring which advantageously increases the manufacturing efficiency of chamber housing 302. Therefore, rolled forging 500 will be the starting point from which chamber housing 302 is machined. Although any dimension may be specially selected to meet particular needs, rolled forging 500 is preferably selected to have a raw inner diameter of about 79 inches, a raw outer diameter of about 93 inches, and a vertical raw height of about 11 inches. Although rolled forgings may be obtained from any suitable supplier, a suitable rolled forging may be obtained from Jorgenson Forge, of Seattle, Wash.

Figure 5B:
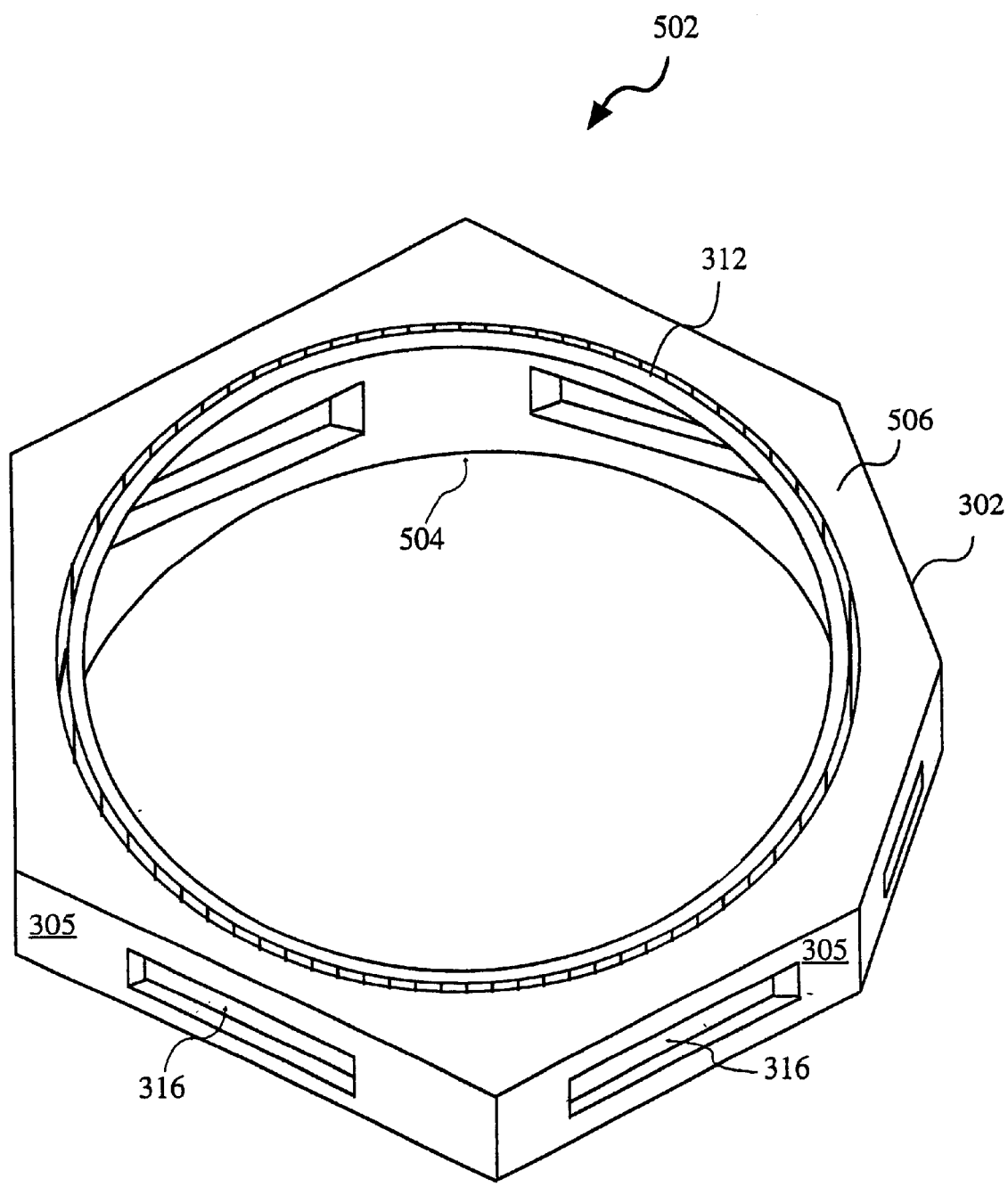
FIG. 5B is a three-dimensional perspective view of a chamber housing after being machined from the rolled forging of FIG. 5A in accordance with a preferred embodiment of this invention.

FIG. 5B is a three-dimensional perspective view of chamber housing 302 after being machined from a rolled forging as described above. It should be appreciated that substantial cost savings are realized due to the reduced amount of machining required to form the various facets 305 of chamber housing 302 and interface ports 316. As compared to weldment and hogout type transport chambers, there may be approximately about a 40 percent time savings in generating a finished transport chamber 300 (e.g., of FIG. 3). By way of example, substantially no welding is required to generate transport chamber 300 which eliminates warping and distortions problems. In addition, very little aluminum is wasted as compared to hogout type chambers.

In this embodiment, top surface 506 of chamber housing 302 is shown having an O-ring seal 312 surrounding the inner diameter of chamber housing 302. As described above, when top plate 304 is placed over chamber housing 302, a vacuum-tight seal is formed when underlip 402 of FIG. 4 sits over O-ring seal 312. In this embodiment, chamber housing 302 may have an outermost diameter of between about 12 inches and 400 inches, and more preferably, between about 30 and 200 inches, and preferably about 91 inches.

Chamber housing 302 also includes a sealing surface lip 504 which is shown to be an underneath surface region of chamber housing 302. As will be better appreciated after bottom plate 306 has been fully described in FIG. 6 below, sealing surface lip 504 will advantageously provide a sealing surface when O-ring seal 314 is sandwiched between bottom plate 306 and chamber housing 302.

Figure 6:
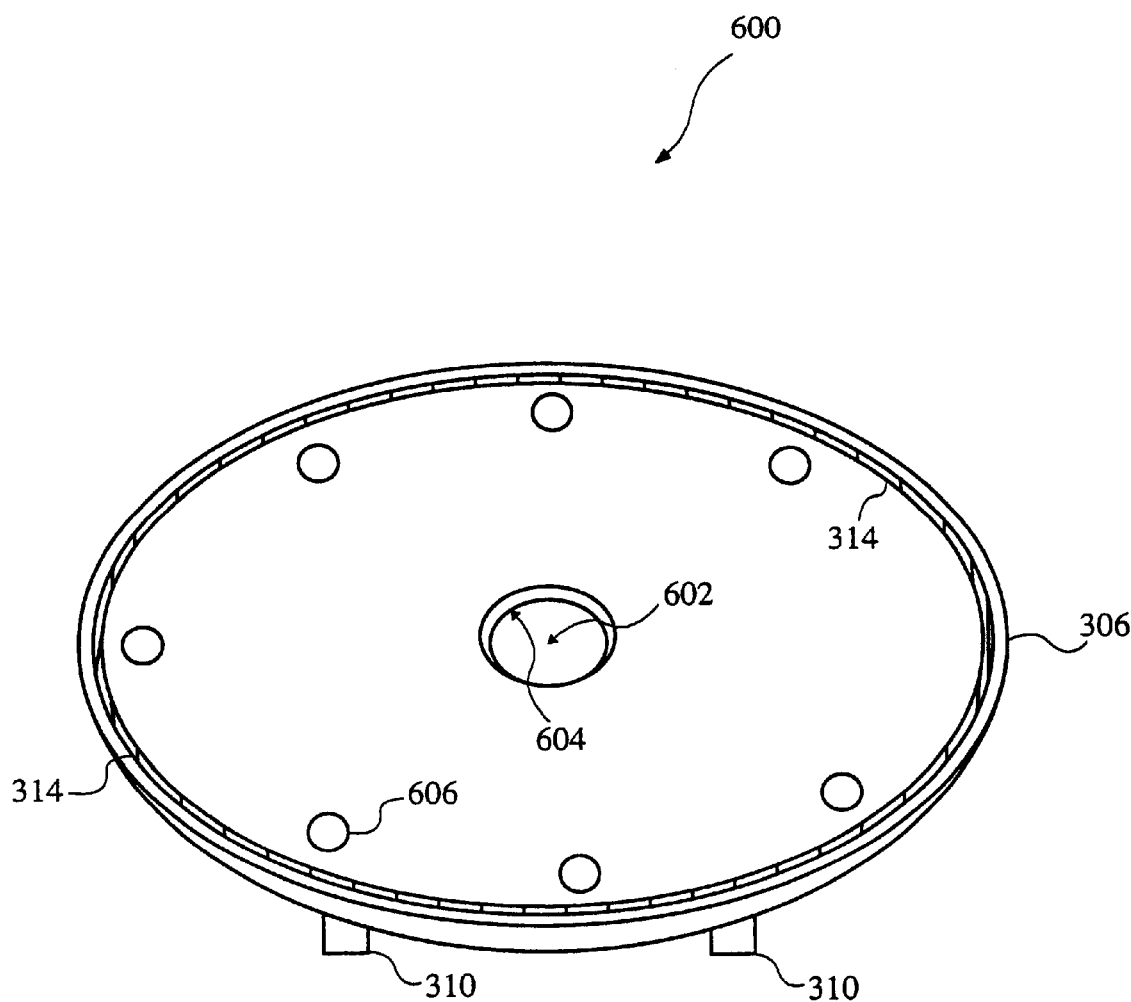
FIG. 6 is a three-dimensional top view of a bottom plate which forms part of the transport chamber of FIG. 3 in accordance with a preferred embodiment of this invention.

FIG. 6 is a three-dimensional top view 600 of bottom plate 306. As shown, bottom plate 306 has a robot drive mounting port 602 designed to allow a robot arm drive (not shown for ease of illustration) to be installed from beneath bottom plate 306. In this manner, the robot arm drive may seal up against an O-ring sealing surface lip 604 which surrounds robot drive mounting port 602 and provides a sealing surface for an O-ring seal. Further, in this embodiment, O-ring seal 314 is shown provided around the perimeter of the top surface of bottom plate 306. In this manner, when bottom plate 306 is secured up against chamber housing 302, O-ring 314 may from a vacuum-tight seal.

Also shown are bores 606 which are defined around the perimeter of bottom plate 306 in order to provide a passage for inserting a shaft portion of a gate drive unit (not shown for ease of illustration). As is well known in the art, gate drives units are generally used to mechanically open and close a gate up against the various interface ports 316 which may lead to processing chambers, load locks and clean rooms. For more information on gate drive units, reference may be made to U.S. patent application Ser. No. 08/679,357 filed on the same day as the instant application, naming Trace L. Boyd and Martin F. Yeoman as inventors, and entitled "Vacuum Chamber Gate Valve and Method for Making Same". This application is hereby incorporated by reference.

In addition, for more information on consumable-type O-rings that may be placed within interface ports 316, reference may be made to U.S. patent application Ser. No. 08/675,994 filed on the same day as the instant application, naming Trace L. Boyd, Richard D. Beer, Eric A. Terbeek and Vernon W. H. Wong as inventors, and entitled "Chamber Interfacing O-Rings and Method for Implementing Same". This application is hereby incorporated by reference.

For illustration purposes, two parallel support beams 310, as described above, are shown traversing the under region of bottom plate 306. Support beams are generally used to provide bottom plate 306 with additional structural support. Although support beams 310 may be eliminated if bottom plate 306 is made thicker, support beams 310 may be used for preferred bottom plate 306 thicknesses of between about 1 and 6 inches, and more preferably, between about 1.5 and 4 inches, and preferably about 2 inches. In this manner, the structural support provided by support beams 310 will be sufficient to withstand the anticipated structural stresses and operational pressures. In addition, since support beams 310 are primarily used to provide structural support, a mild steel which is stronger and stiffer than aluminum may be used. In this embodiment, the preferred diameter of bottom plate 306 may be between about 12 inches and 400 inches, and more preferably, between about 30 and 200 inches, and preferably about 80 inches.

Figure 7:
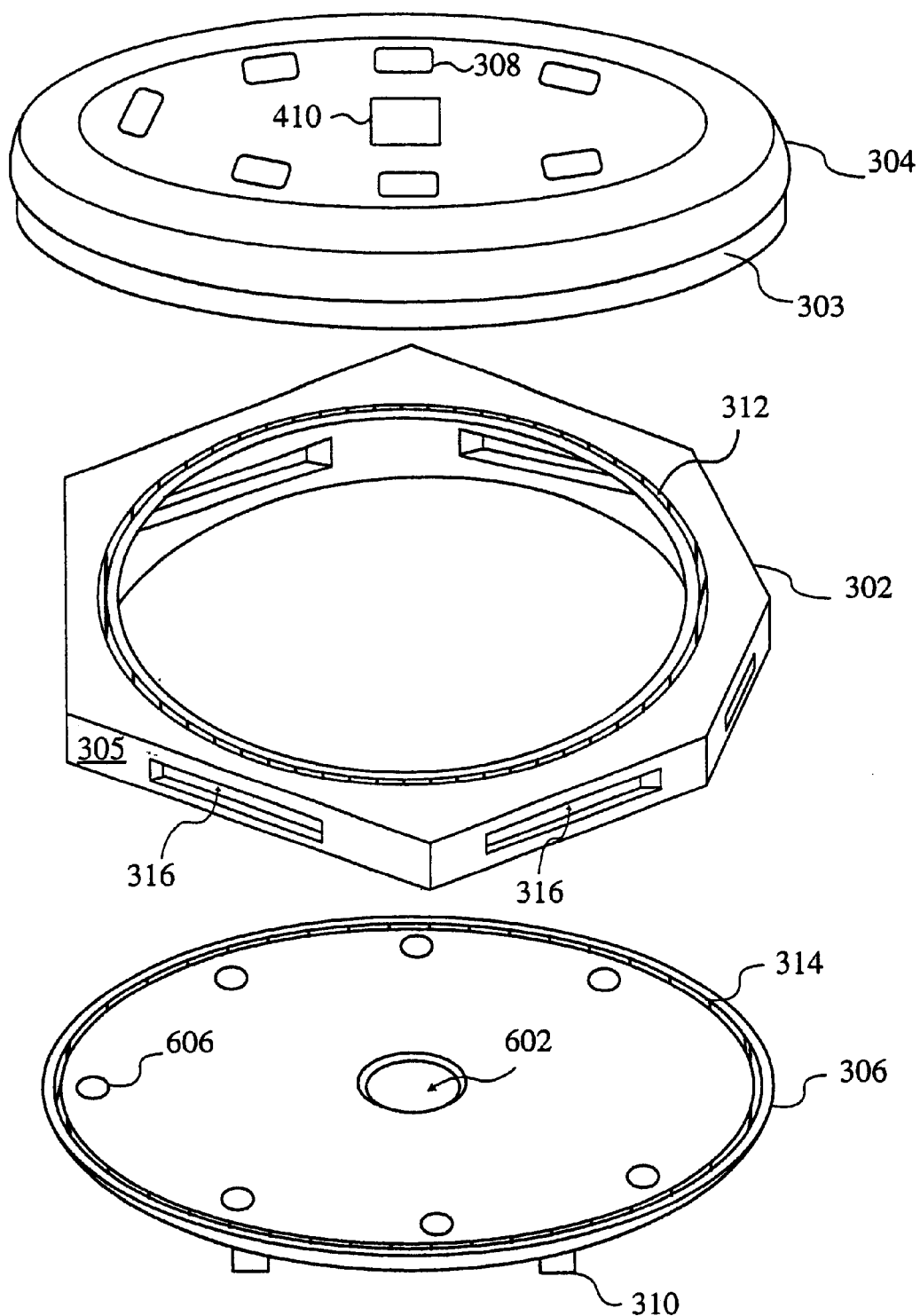
FIG. 7 is an exploded view of FIG. 3 in accordance with a preferred embodiment of this invention.

FIG. 7 is an exploded view 700 of FIG. 3 illustrating how top plate 304 may be placed over and into chamber housing 302, and how chamber housing 302 may receive bottom plate 306. Once the three-part structure is bolted together using any suitable bolting mechanism, the resulting transport chamber may form a vacuum-tight chamber which may be maintained under vacuum conditions during operation.

To maximize throughput, transport chamber 300 may be equipped with two or more IN-ports for receiving substrates, and the remaining interface ports may be used to connect up to processing modules. In this manner, a greater number of substrates may be processed throughout the chambers of the cluster architecture. By way of example, when one IN-port is waiting for a load lock to be pressured down, a previously pressured down load lock may introduce a new substrate into the transport chamber. Further, it should be appreciated that each load lock may hold a multiplicity of substrates which are stacked in a cassette arrangement. A representative load lock must therefore be large enough to hold cassettes of substrates so that once the load lock is pressured down, the transport chamber robot arm may be able to access all the substrates in the pressured down load lock without having to sit idle during a pressure down operation each time a substrate is needed.

Structurally, transport chamber 300 is rather heavy and may be supported off the ground so that the aforementioned robot arm, gate drive, and accompanying electronics may be installed from below bottom plate 306. There may be situations where bottom plate 306 may need to be disengaged from chamber housing 302 in order to maintenance transport chamber 300. Advantageously, a support structure may preferably be made of mild steel (not shown) and mounted to an outer under surface 706 of chamber housing 302. In this manner, bottom plate 306 may be partially or completely removed without having to disassemble the entire transport chamber 300.

Initially, substrates being transported into transport chamber 300 are in a pre-processed stage. In one embodiment, the substrates may be further processed in order to generate flat panel displays (FPDs) which are typically exposed to number of etching processes. By way of example, the assignee of this application identifies this cluster architecture by the trademark name "Continuum". However, it should be borne in mind that the transport chamber 300 and its associated processing modules may be used in any processing system to fabricate a variety of different articles of manufacture. By way of example, transport chamber 300 may be used to transport semiconductor wafers, disk drives, items needing metal plating and etching. Broadly speaking, the disclosed embodiments may also be used for depositing films, freeze drying foods and any other application implementing a vacuum transport chamber and associated processing modules.

Although the foregoing invention has been described in some detail for purposes of clarity of understanding, it will be apparent that certain changes and modifications may be practiced within the scope of the appended claims. In addition, although the preferred materials used to make chamber housing 302, top plate 304, and bottom plate 306 is aluminum, any other suitable material such as stainless steel, etc., may be substituted therefor. Therefore, the present embodiments are to be considered as illustrative and not restrictive, and the invention is not to be limited to the details given herein, but may be modified within the scope and equivalence of the appended claims.

What is claimed is:

1. A chamber, comprising:

a rolled forging body defined as an integral ring that has a cylindrically shaped inner wall, a bottom surface and a top surface;

a plurality of interface ports defined through the cylindrically shaped inner wall of the rolled forging body, the plurality of interface ports provide transport paths in and out of an internal region of the integral ring;

a plurality of facets defined around an outer surface of the integral ring to provide interface connection surfaces;

a top plate configured to fit over and seal the top surface of the integral ring; and a bottom plate configured to fit under and seal the bottom surface of the integral ring.

2. A chamber as recited in claim 1, further comprising:

an upper O-ring that fits between the top plate and the top surface of the integral ring.

3. A chamber as recited in claim 1, further comprising:

a lower O-ring that fits between the bottom plate and the bottom surface of the integral ring.

4. A chamber as recited in claim 1, wherein the top plate has a circular stepped lip, the circular stepped lip includes a first circular portion that is configured to partially fit within the internal region of the cylindrically shaped inner wall, and a second circular portion that is configured to sit over and seal the top surface of the integral ring.

5. A chamber as recited in claim 1, wherein the top plate has a thickness of between about 3 and 5 inches.

6. A chamber as recited in claim 1, wherein the top plate has at least one view port hole, and the at least one view port hole of the top plate is sealed with a clear plastic material to enable viewing of the internal region of the chamber.

7. A chamber as recited in claim 6, wherein the clear plastic material is removable to facilitate internal maintenance of the chamber.

\* \* \* \* \*